United States Patent
Kaneko et al.

[15] 3,638,218

[45] Jan. 25, 1972

[54] DRIFT COMPENSATION SYSTEM FOR A CASCADE-TYPE ENCODER

[72] Inventors: Haruo Kaneko; Yoshio Katagiri, both of Tokyo, Japan

[73] Assignee: Nippon Electric Company, Tokyo, Japan

[22] Filed: Aug. 31, 1970

[21] Appl. No.: 68,069

[30] Foreign Application Priority Data

Nov. 1, 1969 Japan ..................................44/88259

[52] U.S. Cl. ................................340/347 CC, 340/347 AD

[51] Int. Cl. ........................................................H03k 13/02

[58] Field of Search..............................340/347 AD, 347 CC

[56] References Cited

UNITED STATES PATENTS

| | | | |
|---|---|---|---|
| 3,070,786 | 12/1962 | MacIntyre | 340/347 CC |
| 3,521,273 | 7/1970 | Saari | 340/347 AD |
| 3,495,233 | 2/1970 | Saari | 340/347 AD |
| 3,460,122 | 8/1969 | Barber | 340/347 AD |

*Primary Examiner*—Maynard R. Wilbur
*Assistant Examiner*—Jeremiah Glassman
*Attorney*—Marn & Jangarathis

[57] ABSTRACT

A drift compensation circuit for a cascade encoder used in a pulse code modulation communication system, including at least first, second through *m*-th encoders connected in cascade for converting an intermittent input analogue signal into an output digital binary signal subject to deterioration in the respective encoders due to drift of the level of direct current utilize to effect energization thereof, comprising first feedback means connected to the first encoder for providing an output of zero level while the input analogue signal is absent therefrom, a reference analogue signal of predetermined level supplied to the second encoder, and second feedback means comparing the levels of digital analogue signals derived from the respective second through *m*-th encoders and corresponding to the reference analogue signal with a predetermined reference digital binary signal representing the reference analogue signal to provide a signal to activate the second encoder to adjust the levels of the derived digital binary signals to coincide with the level of the reference digital binary signal.

6 Claims, 12 Drawing Figures

INVENTORS
Haruo Kaneko
Yoshio Katagiri
BY
Marn & Jangarathis
ATTORNEYS

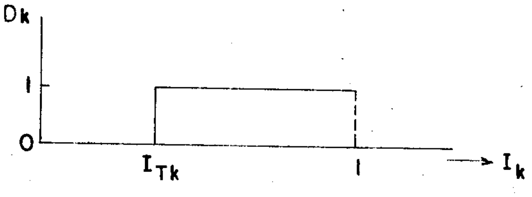
Fig. 2(c).
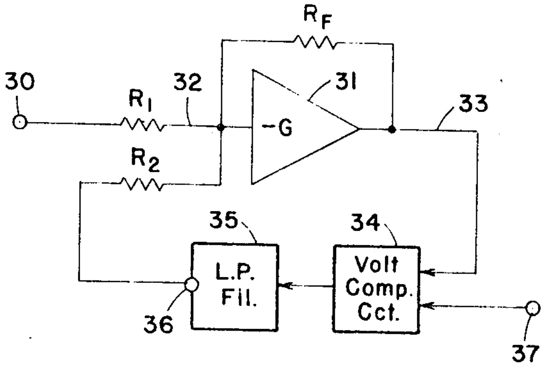
Fig. 3.
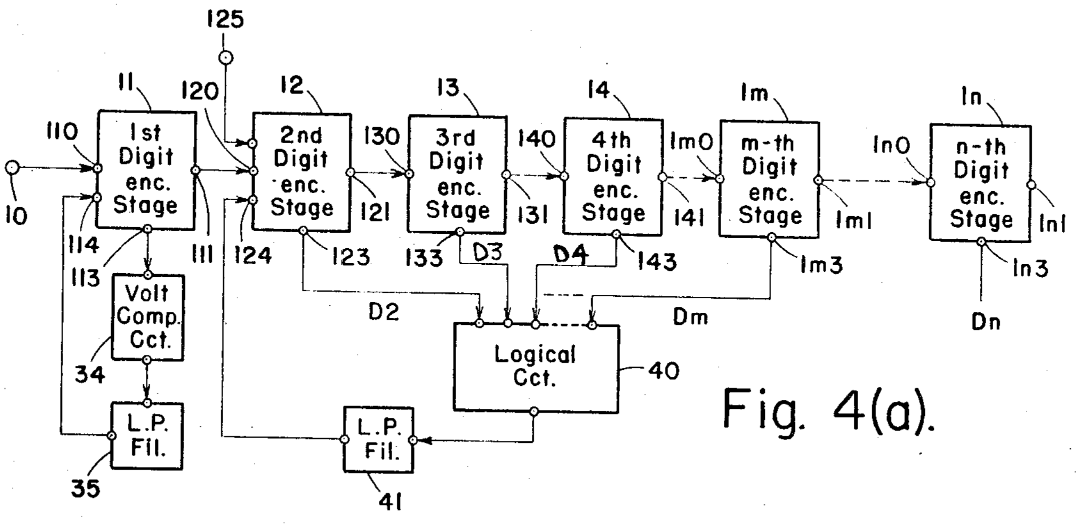
Fig. 4(a).
Fig. 4(b). Fig. 4(c).
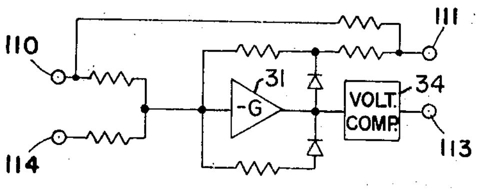
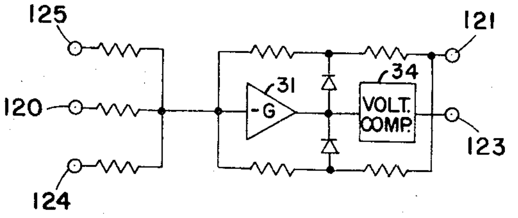
INVENTORS
Haruo Kaneko
Yoshio Katagiri
BY
Marn & Jangarathis
ATTORNEYS INVENTORS
Haruo Kaneko
Yoshio Katagiri
BY
Marn & Jangarathis
ATTORNEYS

DRIFT COMPENSATION SYSTEM FOR A CASCADE-TYPE ENCODER

DETAILED DESCRIPTION OF INVENTION

The present invention relates to a drift compensation system for a cascade-type encoder for converting a pulse-amplitude modulated signal into a binary code in a PCM communication system and, more particularly, to a drift compensation system for compensating the input side DC drift of the preceding stages whose compensation is effective on the overall compensation accuracy of such a cascade-type encoder in which each of its unit encoder stages has an operational amplifier.

A cascade-type encoder is required, even if it has excellent characteristics in terms of accuracy and speed, to exhibit higher performance, when the input analogue information to be handled is diversified, ranging from the voice signal to frequency-division-multiplexed voice signal, a TV video signal, a facsimile signal, a data information, and the like. Since some of these information, such as video signal and a data signal, include DC components, the DC drift in the sample holding circuit disposed in the stage preceding the encoding circuit becomes a factor of deteriorating the overall characteristics of the system.

One of the conventional systems for compensating the DC drift is such that the DC drift in each operational amplifier stage in each unit encoder stage is compensated. Another system is such that the range of the DC drift of each operational amplifier is estimated in advance, and the DC drift within the estimated range is compensated. In the latter system, since the effect of the DC drift in the sample holding circuit or the like is superimposed on the input signal, and since the drift generally appears in a fairly wide range of value, the compensation system cannot follow the drift in some cases.

An object of this invention is therefore to provide a drift compensation system in which those errors of an encoder of the cascade type are compensated, which errors include the DC drift produced in the input sample holding circuit, the DC drift in the operational amplifier of each encoder stage, and other errors produced in each encoder stage (the latter will be described later).

The system according to this invention is a drift compensating system for a cascade-type encoder having first, second, third . . . *m*-th, . . . and *n*-th encoder stages connected in cascade so as to convert an analogue signal into an *n*-digit binary signal, each said second to *n*-th encoder stages having means for comparing a reference DC level and incoming analogue signal supplied from a preceding one of said encoder stages to generate a digital output representative of the result of the comparison as a digit of the binary signal, the first encoder stage having the reference DC level at zero level to generate a digital value representative of the polarity of the analogue signal, the system comprising: means coupled to the first encoder stage for maintaining its analogue output at zero level in the idle period where the analogue signal is not applied to its input; means for supplying a predetermined reference analogue signal to the second encoder stage in a period within the idle period, the reference analogue signal being of such a value as does not require the comparison operation for second to (*m*-1)-th encoder stages but requires the same for *m*-th encoder stage; a logic means supplied with the digital output from the second to *m*-th encoder stages for comparing the supplied digital value with a reference digital value representative of the reference analogue signal; means responsive to the output of the logic means for changing the reference DC level of the second encoder stage so as to make the digital output supplied to the logic means coincide with the reference digital value.

BRIEF DESCRIPTION OF THE DRAWING

The invention will be explained in detail by referring to the appended drawings in which:

FIG. 2(*a*) is a circuit diagram of a unit encoder included in FIG. 1;

FIGS. 2(*b*) and (*c*) are curves illustrating action obtainable in FIG. 1;

FIG. 3 is a block diagram of a conventional DC drift compensating circuit for an amplifier;

FIG. 4(*a*) is a block diagram of a specific embodiment of the present invention for achieving DC drift compensation in a multistage encoder usable in a pulse code modulation communication system;

FIGS. 4(*b*) and (*c*) are circuit diagrams of components usable in FIG. 4(*a*);

FIGS. 6(*b*) and (*c*) illustrate components usable in FIG. 6(*a*).

DETAILED DESCRIPTION OF THE DRAWING

Figures 1, 2A, 2B:
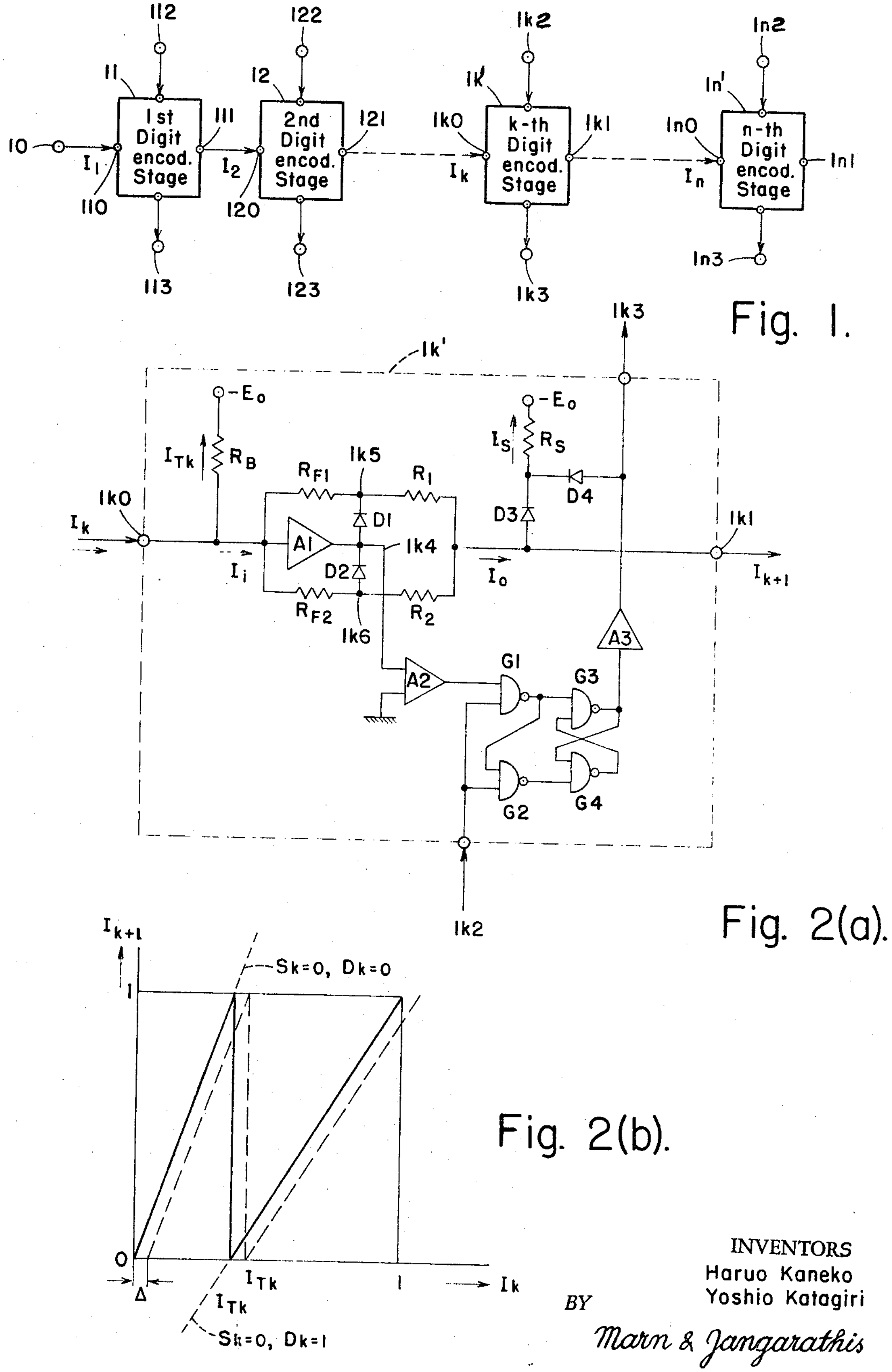
FIG. 1 is a block diagram of a conventional *n*-digit cascade-type encoder.

In FIG. 1, reference numeral 10 denotes an input terminal for an analogue signal; 11, a first digit unit encoder stage; 12, a second digit unit encoder stage; **1*k*'**, a *k*-th digit unit encoder stage; and **1*n*'**, *n*-th digit unit encoder stage. The reference numerals 110, 120, . . ., **1*k*0, . . ., 1*n*0** denote input terminals of the first, second, *k*-th and *n*-th digit unit encoder stages respectively; 111, 121, . . ., **1*k*1, . . ., 1*n*1** indicate output terminals of the first, second, . . ., *k*-th, . . ., *n*-th digit unit encoder states, respectively; 112, 122, . . ., **1*k*2, . . ., 1*n*2 denote sampling pulse input terminals; and 113, 123, . . ., 1*k*3, . . ., 1*n*3** indicate digital code output terminals of the unit encoder stages.

The encoder shown in FIG. 1 operates in the following manner. An input signal $A_1$ (voltage or current) is given as signal current $I_1$ to input terminal 10. The polarity of this signal is sensed by first digit unit encoder stage 11 (polarity sensing stage). The signal is then delivered as unipolarity signal $A_2$ (notation for normalized signal) with a value of 0 to 1. The signal $A_2$ is transmitted in the form of a signal current shown by $I_2$ in FIG. 1 to the second digit unit encoder stage. In the second digit unit encoder stage, a bias current corresponding to $I_2$ is given to discriminate whether the input signal $A_2$ is larger or smaller than a threshold level $T_2$. The result is delivered as the second digit PCM code. At the same time, a switching circuit is driven to perform computation as shown in FIG. 2(*b*) in the manner as will be explained in connection with the operating principle of the unit encoder stage of FIG. 2(*a*). Thus, an analogue input signal $A_3$ (normalized value corresponding to $I_3$) of the third digit unit encoder stage (not shown) is obtained. Then, a bias current corresponding to threshold level $T_3$ is given to the third digit unit encoder stage, and the same operation as in the second digit unit encoder stage is completed. Current *Ik* and *In* represent input signal current for encoder stages l*k*' and l*n*', respectively. In this way, encoding is performed in succession to the last *n*-th digit.

FIG. 2(*a*) shows an example of the *k*'-th digit unit encoder stage, which is one of the unit stages composing the *n*-unit binary encoder shown in FIG. 1. The unit encoder stage shown in FIG. 2(*a*) consists of an operational amplifier $A_1$ with a high gain for amplifying a wide band signal and inverting the polarity of the wide band signal; feedback resistors $R_{F1}$ and $R_{F2}$; a bias resistor $R_B$ connected to reference power source $-E_0$ which is to subtract threshold current $I_{TK}$ (this current determines the code judging point of the *k*-th digit) from input analogue signal current $I_K$; transmission resistors $R_1$ and $R_2$ for converting the output voltage obtained from the *k*-th digit operational amplifier $A_1$ into a current signal and for sending this current signal to the next (*k*+1)-th digit unit encoder stage; diodes $D_1$ and $D_2$ for determining the feedback path of operational amplifier $A_1$ to pass through $R_{F1}$ or $R_{F2}$ depending upon the polarity of the output of the operational amplifier; an amplifier $A_2$ in which the output voltage of operational amplifier $A_1$ in the small level region is amplified, and the output voltage in the large level region is limited; a flip-flop which consists of NAND-gates $G_1$, $G_2$, $G_3$, and $G_4$, and generates a "1" or a "0" pulse by gating the flip-flop by the sampling pulse $1k2$ depending on whether the output of amplifier $A_2$ is positive or negative; a pulse buffer amplifier $A_3$; and a switching circuit consisting of diodes $D_3$ and $D_4$ driven by amplifier $A_3$ and a resistor $R_S$.

Constants $R_B$, $RF_1$, $RF_2$, $R_1$, $R_2$ and $R_S$ are determined in the following manner. As described above, since the amplifier $A_1$ has a high voltage current gain, the voltage at input point $1k0$ can be considered substantially zero. From the figure, it follows:

$$R_B = E_0/I_{Tk} \quad (1)$$

It is assumed here that the variable range of input analogue signal current $I_k$ is (0, +1), the input current to amplifier $A_1$ is positive or negative depending on whether $I_k$ is larger or smaller than $I_{Tk}$.

(i) For $0 \leq I_k \leq I_{Tk}$

Since $I_i = I_k - I_{Tk} \leq 0$, the potential at output point $1k4$ of amplifier $A_1$ increases toward positive by the current $I_i$. As a result, the current $I_i$ flows through the feedback path of $RF_1$ and $D_1$. In this case, no current flows through the other feedback path of $RF_2$ and $D_2$ since the diode $D_2$ is biased in the reverse direction. Therefore, assuming that a voltage at output point $1k5$ is $V_1$, and a voltage at output point $1k6$ is $V_2$, the following equations are obtained:

$$V_1 = -R_{F1} \times (I_k - I_{Tk})$$
$$V_2 = 0$$

Hence, the output current $I_{0\ 0}$ (shown in FIG. 2(*a*) is expressed by $$I_0 = (R_{F1}/R_1) \times (I_k - I_{Tk}) \quad (2)$$

While, a positive or zero voltage appears at output point $1k4$. This positive signal is amplified by amplifier $A_2$. If the signal value is large, this signal receives amplitude limiting, and its polarity is reversed. Then the signal is given to the flip-flop which consists of NAND-gates $G_1$, $G_2$, $G_3$ and $G_4$. This flip-flop is set or reset by the analogue signal supplied from $A_2$ when the sampling pulse $1k2$ is "1." The state of the flip-flop determined immediately before the sampling pulse is inverted from "1" to "0" is held during the period in which the sampling pulse is "0." It is assumed that when the output of amplifier $A_1$ is positive or zero, the flip-flop is reset, the polarity of the input signal of pulse buffer amplifier $A_3$ becomes negative, and that of the output $1k3$ becomes also negative. Under this state, the current $I_S$ flowing the reference power source $-E_0$ flows through diode $D_3$ and not $D_4$. In other words, when the diode $D_4$ is brought to cutoff state, the switch current $I_S$ is subtracted from the output of $k$-th digit unit encoder stage. Accordingly, the transmission analogue output signal to the next $(k+1)$-th is expressed by the following equation:

$$I_{k+1} = I_0 - I_s$$
$$= -\frac{R_{F1}}{R_1} \times (I_k - I_{TK}) - I_S \quad (3)$$

(ii) For $I_{Tk} < I_k \leq 1$

Since $I_i = I_k - I_{Tk} > 0$, the potential at the output point $1k4$ of amplifier $A_1$ turns negative, causing the current $Ii$ to flow through the feedback path of $R_{F2}$ and $D_2$. On the contrary, no current flows through the other feedback path of $R_{F1}$ and $D_1$ since $D_1$ is backward biased. Therefore, voltages $V_1$ and $V_2$ at output points $1k5$ and $1k6$ are:

$$V_1 = 0$$
$$V_2 = -R_{F2} \times (I_k - I_{Tk})$$

Hence, output current $I_0$ is:

$$I_0 = (-R_{F2}/R_2 \times (I_k - I_{Tk}) \quad (4)$$

Under this state, a negative voltage appears at the output point $1k4$. This signal is amplified by amplifier $A_2$. When this signal is large, it is amplitude-limited and polarity-reversed. As a result a positive voltage is supplied to the flip-flop. Thus the flip-flop is set by the sampling pulse, the input signal to pulse buffer amplifier $A_3$ turns positive and, at the same time, the output signal at $1k3$ turns positive. Under this condition, $D_4$ turns on, $D_3$ is reversely biased, and switch current $I_S$ is disconnected from this unit encoder stage output point. Accordingly, the transmission analogue output signal to the next $(k+1)$-th stage is:

$$I_{k+1} = (-R_{F2}/R_2) \times (I_k - I_{Tk}) \quad (5)$$

The output signal current $(I_{k+1})$ at output point $1k_1$ is determined by equations (3) and (5) depending on whether the value of input signal current $I_k$ is larger or smaller than $I_{Tk}$. On the contrary, because the operational amplifier $A_1$ is formed of a negative feedback amplifier with the polarity at its input and output mutually reversed, the following conditions must be satisfied for equations (3) and (5) to coincide with the normalized input and output characteristics as shown in FIG. 2(*b*).

In equation (3):
When $I_k = 0$, $I_{k+1} = 0$
When $I_k = I_{Tk}$, $I_{k+1} = -1$
In equation (4):
When $I_k = I_{Tk}$, $I_{K+1} = 0$
When $I_k = 1$, $I_{k+1} = -1$ Finally, in order to obtain the normalized output characteristics, the polarity of the output signal is to be reversed. More specifically, $$0 = +\frac{R_{F1}}{R_1} I_{Tk} - I_S$$
$$1 = I_S$$
$$1 = \frac{R_{F2}}{R_2}(1 - I_{Tk})$$

must be satisfied, rearranging the above equations:

$$I_S = 1$$
$$(R_{F1}/R_1) = (1/I_{Tk})$$
$$(R_{F2}/R_2) = (1/1 -_{Tk}) \quad (6)$$

Also, $$R_B = (F_0/I_{Tk}) \quad (7)$$

when the gap voltage of diode $D_3$ is assumed $E_D$, $$R_S = (E_0 - E_D/I_S) = E_0 - E_D \quad (8)$$

Since $I_{Tk}$ is given in a normalized form, the following relationship is obtained when the resistance values are determined so as to satisfy equations (6), (7) and (8).

$$\text{When } 0 \leq I_k \leq I_{Tk},\ I_{k+1} = -(I_k/I_{Tk}) \quad (9)$$
$$\text{When } I_{Tk} < I_k \leq 1,\ I_{K+1} = (I_k - I_{Tk}/1 - I_{Tk}) \quad (10)$$

When $I_{Tk}$ is normalized on the supposition that the polarity is reverse, the result becomes equal to that shown in FIG. 2(*b*), and the characteristic as shown in FIG. 2(*b*) is obtained. An example of digital output $1k3$ with respect to input $I_k$ is shown in FIG. 2(*c*).

In the encoder in which the unit encoder stages as mentioned above are connected in cascade, it is assumed that a DC drift produced by converting the second digit unit encoder stage is Δ. The DC drift mentioned here is assumed to be observed at the input point of the second digit unit coding stage, as an equivalent value for an overall drift of a plurality of unit encoder stages, each of which has inherent input voltage drift. Due to the drift Δ, the characteristic curve of the second digit unit encoder stage is shifted as shown by the broken line in FIG. 2(*b*) because the bias current is varied from $I'_{Tk}$. Especially in the vicinity of zero of input signal $I_k$, a step error of Δ is produced. Generally, when a voice signal or the like is subjected to PCM conversion, the value of the quantized step in the vicinity of zero of input analogue signal is very small in the encoder with a nonlinear companding characteristic which is effective for improving the signal vs. quantizing noise ratio at a low level. As a result, the characteristic is largely deteriorated due to the DC drift.

Several methods have been proposed in order to increase the accuracy of the encoder in a low level region. For example, the DC drift of each operational amplifier is reduced by each unit, or the DC drift is compensated in each operational amplifier of each encoder stage. Furthermore, in another method, as shown in "An Approach to Logarithmic Coders and Decoders" by C. L. Dammann (1966 NEREM Record pp. 196 to 197), a reference current is supplied to the input point of second digit unit encoder stage during a pause period of encoding and the output detected by the fifth digit encoder stage is used for compensating the drift. This method will further be explained in comparison with that of this invention.

FIG. 3 is a block diagram showing an example of conventional compensating systems for compensating the DC drift of a single unit of a DC operational amplifier. The reference numeral 30 denotes a signal input terminal, and 31 a DC amplifier having gain $-G$. A negative feedback is given to input point 32 from output point 33 via a feedback resistor $R_F$. $R_1$ denotes a resistor for converting the voltage of input signal into a current signal, and 34 a voltage comparison circuit, such as a flip-flop circuit shown in FIG. 2(*a*). A sampling pulse is supplied to this circuit via a terminal 37. The reference 35 indicates a low pass filter. A feedback circuit is formed by output terminal 36, resistor $R_2$ and input point 32 of amplifier 31. The comparator 34 gives an output of "1" (high potential side) when the voltage appearing at output point 33 is positive, or gives an output of "0" (low potential side) when it is negative. This output is sent to the low pass filter. During the period which no signal is applied to the amplifier 31, no signal as applied to input terminal 30 and this terminal is kept at zero voltage. Under this state, when output point 33 of amplifier 31 is positive, this positive state is read by the sampling pulse, and flip-flop 34 is set to keep its output "1" until the next sampling pulse comes in. Accordingly, when output point 33 is in the positive state, a positive DC current smoothed through low-pass filter 35 is fed back to input point 32 of amplifier 31, in order to lower the voltage at output point 33 of amplifier 31 in the negative direction. When this feedback compensation current is increased positively, the voltage at output point 33 is shifted toward the negative side, and thus a negative compensation current is fed back through resistor $R_2$ in the next sampling period. Namely, control is effected in the negative direction when the output voltage of the amplifier is positive, or control is effected in the positive direction when the amplifier output voltage is negative. This operation is repeated and thus the DC drift of amplifier 31 is compensated.

FIG. 4(*a*) is a block diagram showing a drift compensation system embodying this invention which effects in an encoder such as cascade-type encoder comprising a plurality of operational amplifiers. In this system, a reference current is applied as an analogue input to the input point of largely weighted near-input stages of the unit encoders, and this analogue input is encoded whereby the DC drift of operational amplifier group of the earlier stages is compensated in the digital fashion.

In a cascade-type encoder for converting an input analogue signal into *n*-unit binary code, it is assumed that the minimum time required for encoding those up to the *m*-th digit (*m* is a positive integer not larger than *n*) is $t_m$ and the time used for converting one sample value of input signal into *n*-unit binary code is $t_n$, and that periods of $t_m$ can be obtained periodically (for example, per each frame) in addition to $t_n$. This latter period is used as the compensation period in which the drift is compensated. During this compensation period, analogue input to the encoder is made zero, and the drift compensation system as shown in FIG. 3 is applied to the second input terminal 114 of the first digit encoder stage 11, and not to the terminal 110 to which the regular analogue input is applied. FIG. 4(*b*) shows an example of input circuit arrangement of the first digit unit encoder stage containing the input terminal 114. A resistor is inserted between the input terminal 114 and the input point of the operational amplifier. This resistor is parallel to the resistor connected between the input terminal for the regular input analogue signal and the input point. The sampling pulse input terminals shown by references 112, 122, . . . 1k2, . . . 1n2 of FIG. 1 and 37 of FIG. 3 are not shown in FIG. 4(*a*). The DC output at output point 111 of the first digit unit encoder stage is made zero, and a reference current for the drift compensation is supplied from the second input terminal 125 of the second digit unit encoder stage 12, and not from the regular analogue signal input terminal 120. The input circuit arrangement including the second input terminal 125 and the third input terminal 124 (which will be described later) is as shown in FIG. 4(*c*) wherein these terminals are connected to the input terminal of the amplifier by way of resistors connected in parallel to the resistor for regular input analogue signal transmission. During the compensation period the second to *m*-th digit unit encoder stages 12 to **1*m* in FIG. 4**(*a*) perform encoding operation by using the reference current as an analogue input signal whereby digital outputs corresponding to the reference current are generated at the respective output terminals 123 through **1*m*3. The logical circuit 40 judges whether this digital output is larger or smaller than the digital output corresponding to the reference current whose value is known in advance, and delivers "1" or "0" output as an output information to the low-pass filter 41. This output is supplied to the third input terminal 124 of the second digit unit coding stage 12**. Thus compensation is made at the input point of the second digit unit encoder stage so that a correct digital output corresponding to the predetermined reference current input is obtained from the second to *m*-th digit encoder stages.

Figure 5:
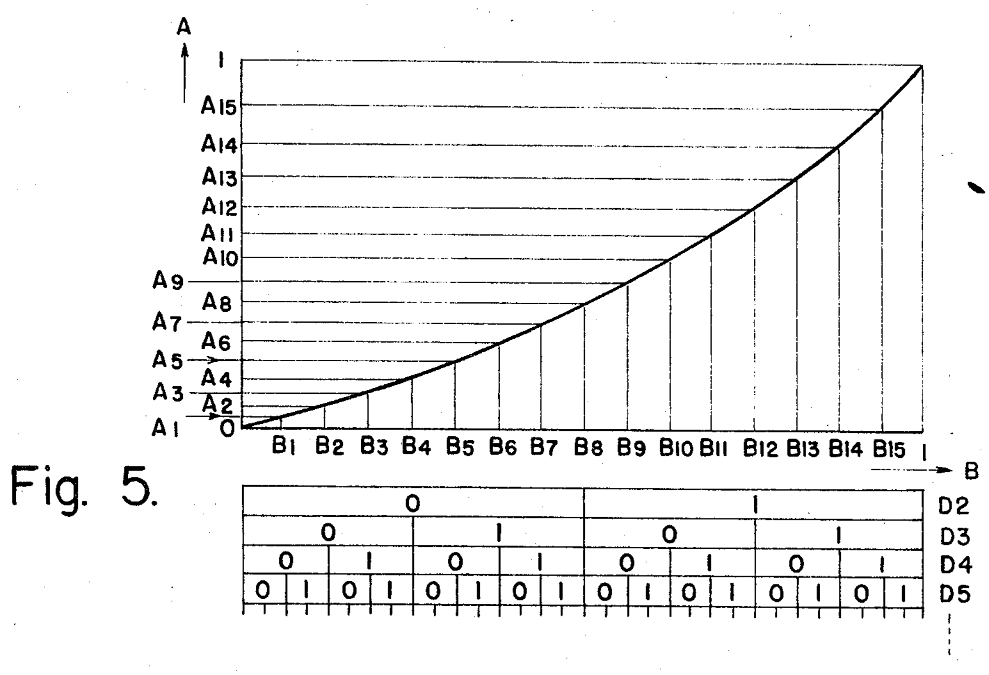
FIG. 5 embraces a curve and a partial table illustrating characteristics of an encoder usable in FIG. 4(*a*)
Figure 6A:
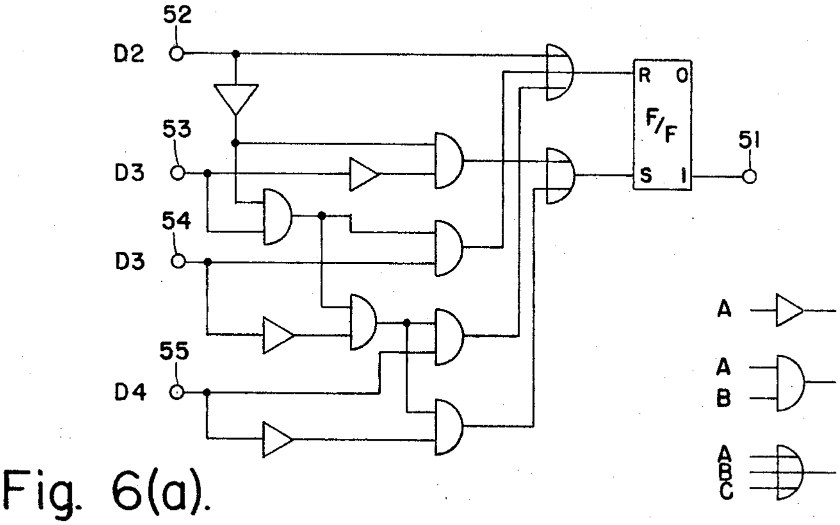
FIG. 6(*a*) is a circuit diagram of a logical circuit usable in FIG. 4(*a*)
Figure 6B:
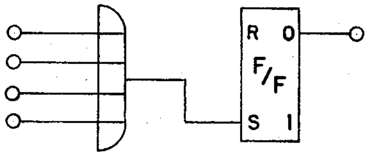
Figure 6C:
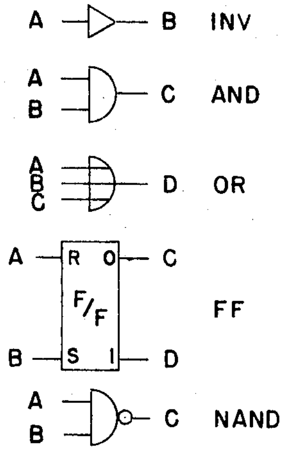

The operation of logical circuit 40 which is an essential part of this invention and operates to determine in digital fashion the direction for drift compensation will be described. FIG. 5 shows an example of characteristics of a cascade-type encoder; the ordinate represents an analogue input signal A supplied to input terminal 120 of the second digit unit encoder stage 12 of FIG. 4(*a*); and the abscissa, a digital output B corresponding to the ordinate. It is assumed that the digital output B is expressed by the codes (1,0) of the second to fifth digits indicated by $D_2$ through $D_5$. The codes after fifth digit are not shown herein. $B_1$, $B_2$, . . . $B_{15}$ denote the boundary points between the ranges in which the fifth digit output becomes "1" or "0." These points are called code judgment operating point hereinafter. The analogue inputs corresponding to the respective code judgment operating points are indicated by the references $A_1$, $A_2$, . . . $A_{15}$. One of eight ($2^{5-3}$) inputs, $A_1$, $A_3$, $A_5$, $A_7$, $A_9$, $A_{11}$, $A_{13}$ and $A_{15}$, which are the code judgment operating points for only fifth digit and not for the second through fourth digit is chosen as the reference current. For example, $A_5$ is chosen. Then the corresponding digital output serves as the boundary point between "0100" and "0101" which are expressed by the second through fifth digits outputs $D_2$, $D_3$, $D_4$ and $D_5$. In this case, the logical circuit 40 of FIG. 4 will be as shown in FIG. 6(*a*) in which reference numerals 52–55 represent digits $D_2$–$D_5$, respectively, as just mentioned. Then the logical circuit 40 functions so that "0" output is produced at the output terminal 51 when the digital output obtained is on the right side with respect to the boundary point of FIG. 5, or "1" output when the digital output obtained is on the left. The blocks shown in FIG. 6(*c*) correspond to those in FIGS. 6(*a*) and 6(*b*), and those blocks have the known functions as shown below. The blocks include NAND gates which compose flip-flops of the unit encoder stage shown in FIG. 2(*a*).

| | | |
|---|---|---|
| INV: | $B=\overline{A}$ | |
| AND: | $C=A\cdot B$ | |
| OR: | $D=A+B+C$ | |
| FF: | output | C = 0, D = being set by B |
| | output | C = 1, D = 0 set by A |
| NAND: | $C=\overline{A\cdot B}$ | |

In this manner, when the digital output generates a code on the right-hand side of the boundary point between "0100" and "0101" including "0101" itself, a negative compensation current is fed back to the third input terminal 124 of the second digit unit encoder stage of FIGS. 4(*a*) and (*c*), whereby the output according to the reference current given during the compensation period is controlled so as to come to the boundary point between "0100" and "0101." During periods other than compensation periods, no reference current is applied thereto. The output of logical circuit 40 is sampled during the compensation period, and its state is maintained in the form of a DC compensation current fed back through the low pass filter until the next sampling point, whereby the encoder maintains normal operation.

Another example of operation of logical circuit 40 of FIG. 4 will be explained by referring to FIG. 6(*b*) wherein $A_1$ which is the minimum one among $A_1$, $A_3$, $A_5$, $A_7$, $A_9$, $A_{11}$, $A_{13}$ and $A_{15}$ is used as the reference current. It is evident from the illustration in FIG. 5 that the circuit 40 is to judge whether the digital output is of "0000" or of other outputs. Therefore, the logical circuit 40 can be formed into the most simple composition.

As has been described, the invention makes it possible to compensate deterioration in the accuracy of a cascade-type encoder, such deterioration being due to the DC drift in its operational amplifier. If only the output $D_5$ of the fifth digit is monitored so as to compensate the drift, the stable point of digital output $D_5$ exists at $B_1$, $B_3$, $B_7$, $B_9$, $B_{11}$, $B_{13}$ and $B_{15}$, in addition to $B_5$. Therefore, it is impossible to compensate the drift at the correct point of $B_5$ when a drift corresponding to the stable points is produced at the input point of the second digit unit encoder stage. Such drawback can be eliminated by the arrangement of this invention because the direction of the drift compensation is determined in the digital fashion.

What is claimed is:

1. A drift-compensating system for a cascade-type encoder having first, second, third, . . . *m*-th . . . and *n*-th encoder stages connected in cascade so as to convert an analogue signal into an *n*-digit binary signal, each said second to *n*-th encoder stages having means for comparing a reference DC level and incoming analogue signal supplied from a preceding one of said encoder stages to generate a digital output representative of the result of the comparison as a digit of said binary signal, said first encoder stage having said reference DC level at zero level to generate a digital value representative of the polarity of said analogue signal, said system comprising:

- means coupled to said first encoder stage for maintaining its analogue output at zero level in the idle period where said analogue signal is not applied to its input;
- means for supplying a predetermined reference analogue signal to said second encoder stage in a period within said idle period, said reference analogue signal being of such a value as does not require said comparison operation for second to $(m-1)$-th encoder stages but requires the same for *m*-th encoder stage;
- a logic means supplied with said digital output from said second to *m*-th encoder stages for comparing the supplied digital value with a reference digital value representative of said reference analogue signal; and
- means responsive to the output of said logic means for changing the reference DC level of said second encoder stage so as to make said digital output supplied to said logic means coincide with said reference digital value.

2. A drift compensation circuit for a cascade encoder used in a pulse code modulation communication system, comprising:

- a source of an intermittent amplitude modulated pulse analogue input signal;
- at least first and second through *m*-th encoders; a first input terminal of said first encoder receiving said input analogue signal thereat for conversion into a digital binary signal provided at a first output terminal thereof and representing the polarity of said input analogue signal; each of said second through *m*-th encoders having an input terminal connected to a first output terminal of a preceding encoder including a first input terminal of said second encoder connected to said first encoder first output terminal for connecting said first through *m*-th encoders in cascade to produce at said second through *m*-th encoder first output terminals successive digital binary signals corresponding to said digital binary signal provided at said first encoder first output terminal, whereby said digital binary signals produced at said first through *m*-th first output terminals are subject to deterioration due to drift of the level of direct current energizing said respective first through *m*-th encoders;
- means compensating for said direct current level drift, including:
  - first feedback means interconnecting a second output terminal and a second input terminal of said first encoder for providing a feedback signal to activate said first encoder to provide a zero output signal at said first and second output terminals thereof during a first time period when said input analogue signal is absent from said first encoder first input terminal;
  - means for applying a reference analogue signal of predetermined level to a second input terminal of said second encoder during a second time period within said first time period; and
  - second feedback means interconnecting second output terminals of said respective second through *m*-th encoders and a third input terminal of said second encoder for comparing the levels of digital binary signals derived from said respective last-mentioned output terminals and corresponding to said reference analogue signal with a predetermined level of a reference digital binary signal representing said reference analogue signal to provide an output signal representing the result of such comparison to activate said second encoder third input terminal to adjust the level of said digital binary signals derived from said last-mentioned output terminals to coincide with said predetermined level of said reference digital binary signal.

3. The drift compensation circuit according to claim 2 in which said second feedback means includes logical means having a plurality of input terminals connected to said second output terminals of said respective second through *m*-th encoders and an output terminal connected to said third input terminal of said second encoder.

4. The drift compensation circuit according to claim 3 in which said second feedback means includes a low pass filter connected between said logical means output terminal and said third input terminal of said second encoder.

5. The drift compensation circuit according to claim 2 in which said second feedback means includes:

- logical means having a plurality of input terminals connected to said second output terminals of said second through *m*-th encoders and having an output terminal; and
- filter means connected between said logical means output terminal and said third input terminal of said second encoder.

6. A drift compensation circuit for a cascade encoder used in a pulse code modulation communication system, comprising:

- a source of an intermittent amplitude modulated pulse analogue signal;
- at least first, second through *m*-th encoders; a first input terminal of said first encoder receiving said input analogue signal for conversion into a digital binary signal provided at a first output terminal thereof and representative of the polarity of said input analogue signal; each of said second through *m*-th encoders having an input terminal connected to a first output terminal of a preceding encoder including a first input terminal of said second encoder connected to said first encoder first output terminal for connecting said second through *m*-th encoders in cascade to produce at said second through *m*-th encoder first output terminals successive digital binary signals corresponding to said digital binary signal provided at said first encoder first output terminal, whereby said digital binary signals produced at said first through *m*-th encoder first output terminals are subject to deterioration due to drift of the level of direct current energizing said respective first through *n*-th encoders; and means compensating for said direct current level drift, including:

first feedback means interconnecting a second output terminal and a second input terminal of said first encoder for providing a feedback signal to activate said first encoder to provide a zero output signal at said first and second output terminals thereof during a first time period when said input analogue signal is absent from said first encoder first input terminal;

means for applying a reference analogue signal of predetermined level to a second input terminal of said second encoder during a second time period within said first time period; and second feedback means interconnecting second output terminals of said respective second through $m$-th encoders and a third input terminal of said second encoder, consisting of:

logical means having a plurality of input terminals connected to said second output terminals of said second through $m$-th encoders for comparing the levels of digital binary signals derived from said respective last-mentioned output terminals and corresponding to said reference analogue signal with a predetermined level of a reference digital binary signal representing said reference analogue signal to provide at an output terminal of said logical means an output signal representing the result of such comparison;

and filter means connecting said logical means output terminal to said second encoder third input terminal to apply thereto said logical means output signal to activate said second encoder to adjust the level of said digital binary signals derived from said second output terminals of said second through $m$-th encoders to coincide with said predetermined level of said reference digital binary signal.

* * * * *